(12) United States Patent
Shin et al.

(10) Patent No.: US 10,542,235 B2
(45) Date of Patent: Jan. 21, 2020

(54) DISPLAY APPARATUS

(71) Applicant: LG Display Co., Ltd., Seoul (KR)

(72) Inventors: Sung-Eui Shin, Seoul (KR); Chiwan Kim, Goyang-si (KR); Taeheon Kim, Seoul (KR); YongWoo Lee, Goyang-si (KR); Kyungyeol Ryu, Goyang-si (KR); YuSeon Kho, Seoul (KR)

(73) Assignee: LG Display Co., Ltd., Seoul (KR)

( * ) Notice: Subject to any disclaimer, the term of this patent is extended or adjusted under 35 U.S.C. 154(b) by 74 days.

(21) Appl. No.: 15/971,077

(22) Filed: May 4, 2018

(65) Prior Publication Data

US 2019/0028669 A1    Jan. 24, 2019

(30) Foreign Application Priority Data

Jul. 18, 2017    (KR) .................. 10-2017-0091122

(51) Int. Cl.
| | |
|---|---|
| *H04R 1/00* | (2006.01) |
| *H04R 25/00* | (2006.01) |
| *H04N 5/64* | (2006.01) |
| *H01L 51/52* | (2006.01) |
| *G02F 1/1333* | (2006.01) |
| *H04R 17/00* | (2006.01) |
| *H04R 1/02* | (2006.01) |

(52) U.S. Cl.
CPC ....... *H04N 5/642* (2013.01); *G02F 1/133308* (2013.01); *H01L 51/524* (2013.01); *H04R 1/025* (2013.01); *H04R 17/00* (2013.01); *G02F 2001/133314* (2013.01); *H04R 2499/15* (2013.01)

(58) Field of Classification Search
CPC ... G02F 1/133308; G02F 2001/133314; H01L 51/524; H04R 17/00; H04R 17/025; H04R 2499/15
USPC ........................................................ 381/388
See application file for complete search history.

(56) References Cited

U.S. PATENT DOCUMENTS

| | | | | |
|---|---|---|---|---|
| 3,737,785 | A * | 6/1973 | Korpel | H03H 9/44 |
| | | | | 708/815 |
| 4,694,347 | A * | 9/1987 | Ito | H04N 5/655 |
| | | | | 348/794 |
| 4,920,296 | A * | 4/1990 | Takahashi | H03H 9/1042 |
| | | | | 310/320 |

(Continued)

FOREIGN PATENT DOCUMENTS

| | | |
|---|---|---|
| KR | 10-2012-0055179 A | 5/2012 |
| KR | 10-2016-0080955 A | 7/2016 |

*Primary Examiner* — Khai N. Nguyen
(74) *Attorney, Agent, or Firm* — Morgan, Lewis & Bockius LLP

(57) ABSTRACT

A display apparatus includes a display panel, a back cover accommodating the display panel, and a sound output unit including at least one sound output module disposed to overlap the display panel. The at least one sound output module includes a support plate including an uneven surface and a piezoelectric element attached on the uneven surface of the support plate and has a shape corresponding to the uneven surface of the support plate. Accordingly, a sound having a straight characteristic within an audible frequency domain may be output, thereby enhancing a sense of reality and an immersion of a viewer watching an image displayed by the display apparatus.

23 Claims, 11 Drawing Sheets

(56) References Cited

U.S. PATENT DOCUMENTS

| | | | | |
|---|---|---|---|---|
| 7,565,949 | B2* | 7/2009 | Tojo | G06F 1/1605 |
| | | | | 181/148 |
| 8,816,981 | B2* | 8/2014 | Kai | G06F 1/1626 |
| | | | | 345/173 |
| 2003/0067449 | A1* | 4/2003 | Yoshikawa | G06F 3/016 |
| | | | | 345/173 |
| 2004/0234095 | A1* | 11/2004 | Yun | H04R 7/04 |
| | | | | 381/412 |
| 2005/0128058 | A1* | 6/2005 | Oyagi | G10K 9/22 |
| | | | | 340/384.1 |
| 2005/0254682 | A1* | 11/2005 | Maekawa | H04R 9/043 |
| | | | | 381/404 |
| 2007/0071259 | A1* | 3/2007 | Tojo | G06F 1/1605 |
| | | | | 381/152 |
| 2012/0038471 | A1* | 2/2012 | Kim | H04N 1/00411 |
| | | | | 340/407.2 |
| 2012/0162143 | A1* | 6/2012 | Kai | G06F 1/1626 |
| | | | | 345/177 |
| 2012/0243719 | A1* | 9/2012 | Franklin | G06F 1/1652 |
| | | | | 381/333 |
| 2019/0028669 | A1* | 1/2019 | Shin | H04N 5/642 |

* cited by examiner

DISPLAY APPARATUS

CROSS-REFERENCE TO RELATED APPLICATIONS

This application claims the benefit of the Korean Patent Application No. 10-2017-0091122 filed on Jul. 18, 2017, which is hereby incorporated by reference as if fully set forth herein.

BACKGROUND

Technical Field

The present disclosure relates to a display apparatus, and in detail, to a display apparatus for outputting a sound.

Discussion of the Related Art

Recently, as society advances to the information-oriented society, the field of display apparatuses which visually express an electrical information signal is rapidly advancing. Various display apparatuses, having excellent performance in terms of thinness, lightness, and low power consumption, are being developed correspondingly.

Examples of the display apparatuses include liquid crystal display (LCD) apparatuses, field emission display (FED) apparatuses, organic light emitting display (OLED) apparatuses, etc.

The LCD apparatuses each include an array substrate including a thin film transistor (TFT), an upper substrate including a color filter and/or a black matrix, and a liquid crystal layer between the array substrate and the upper substrate. The LCD apparatuses are apparatuses where an alignment state of the liquid crystal layer is adjusted with an electric field generated between two electrodes provided in a pixel area, and a transmittance of light is adjusted based on the alignment state, thereby displaying an image.

The organic light emitting display apparatuses, self-emitting apparatuses, have a fast response time, high emission efficiency, excellent luminance, and a wide viewing angle in comparison with other display apparatuses, and thus, are attracting much attention.

SUMMARY

Generally, display apparatuses display an image on a display panel, but a separate speaker should be installed for providing a sound. In a case where a speaker is installed in a display apparatus, a traveling direction of a sound output through the speaker is a direction toward a side end or an upper/lower end of the display panel, instead of a front surface or a rear surface of the display panel, and thus, the sound does not travel in a direction toward a viewer who is watching an image in front of the display panel, whereby the viewer's immersion watching the image is hindered.

And, a sound output through a speaker travels to a side surface of a display panel or an upper/lower surface of the display panel, and for this reason, the quality of the sound is degraded due to interference of a sound reflected from a wall or a floor.

And, in a case where a speaker included in a set apparatus such as televisions (TVs) is provided, the speaker occupies a certain space, and due to this, the design and space disposition or arrangement of the set apparatus are limited.

Therefore, the inventors have recognized the above-described problems and have conducted various experiments so that when watching an image in front of a display panel, a traveling direction of a sound becomes a direction toward a front surface of the display panel, and thus, sound quality is enhanced. Through the various experiments, the inventors have implemented a display apparatus having a new structure, which outputs a sound so that a traveling direction of a sound becomes a direction toward a front surface of a display panel, thereby enhancing sound quality.

Accordingly, embodiments of the present disclosure are directed to a display apparatus that substantially obviates one or more of the problems due to limitations and disadvantages of the related art.

An aspect of the present disclosure is to provide a display apparatus which outputs a sound in a direction toward a front surface of a display panel.

Another aspect of the present disclosure is to provide a display apparatus which maximizes a sense of reality and immersion by using a winding piezoelectric element.

Another aspect of the present disclosure is to provide a display apparatus which synthesizes sound frequencies output through a winding piezoelectric element to control a directionality of the sound.

Another aspect of the present disclosure is to provide a display apparatus which matches an image output position with a sound output position to maximize a sense of reality and immersion.

Another aspect of the present disclosure is to provide a display apparatus in which a speaker is not separately disposed in a space other than a region of a display panel, and thus, a sense of design beauty is enhanced.

The objects of the present disclosure are not limited to the aforesaid, but other objects not described herein will be clearly understood by those skilled in the art from descriptions below.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, a display apparatus comprising a display panel, a back cover accommodating the display panel, and a sound output unit including at least one sound output module disposed to overlap the display panel, wherein the at least one sound output module includes a support plate including an uneven surface and a piezoelectric element attached on the uneven surface of the support plate and has a shape corresponding to the uneven surface of the support plate.

Details of other embodiments are included in the detailed description and the drawings.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principles of the disclosure. In the drawings.

DETAILED DESCRIPTION

Figure 1A:
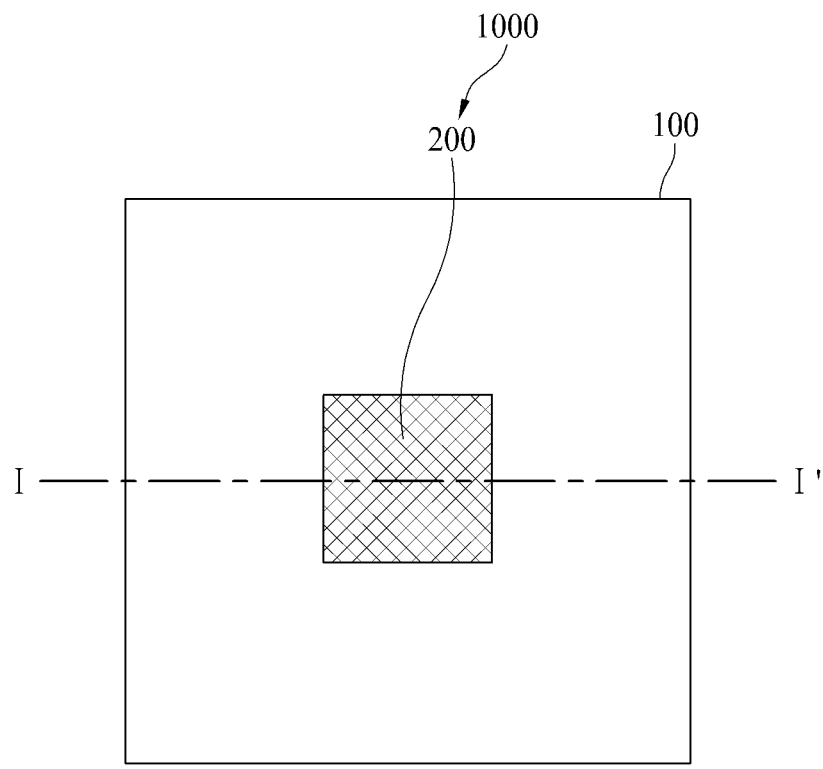
FIG. 1A is a diagram illustrating a display apparatus according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first", "second", etc. may be used. The terms are merely for differentiating one element from another element, and the essence, sequence, order, or number of a corresponding element should not be limited by the terms. It will be understood that when an element or layer is described as being "connected", "coupled", or "adhered" to another element or layer, the element or layer can be directly connected or adhered to the other element or layer, but the other element or layer can be "disposed" between elements or layers, or elements or layers can be "connected", "coupled", or "adhered" to each other through the other element or layer.

In the present disclosure, examples of a display apparatus may include a narrow-sense display apparatus such as an organic light emitting display (OLED) module or a liquid crystal module (LCM) including a display panel and a driver for driving the display panel. Also, examples of the display apparatus may include a set device (or a set apparatus) or a set electronic apparatus such as a notebook computer, a TV, a computer monitor, an automotive display or another type of equipment display including for vehicles, or a mobile electronic device such as a smartphone or an electronic pad, which is a complete product (or a final product) including an LCM or an OLED module.

Therefore, in the present disclosure, examples of the display apparatus may include a narrow-sense display apparatus itself, such as an LCM or an OLED module, and a set apparatus which is a final consumer apparatus or an application product including the LCM or the OLED module.

In some examples, an LCM or an OLED module including a display panel and a driver may be referred to as a narrow-sense display apparatus, and an electronic apparatus which is a final product including an LCM or an OLED module may be referred to as a set device or a set apparatus. For example, the narrow-sense display apparatus may include a display panel, such as an LCD or an OLED, and a source printed circuit board (PCB) which is a controller for driving the display panel. The set apparatus may further include a set PCB which is a set controller electrically connected to the source PCB to overall control the set apparatus.

A display panel applied to the present embodiment may use all types of display panels such as a liquid crystal display panel, an organic light emitting diode (OLED) display panel, and an electroluminescent display panel, but is not limited to a specific display panel which is vibrated by a sound generation device according to the present embodiment to output a sound. Also, a shape or a size of a display panel applied to a display apparatus according to the present embodiment is not limited.

For example, if the display panel is the liquid crystal display panel, the display panel may include a plurality of gate lines, a plurality of data lines, and a plurality of pixels respectively provided in a plurality of pixel areas defined by intersections of the gate lines and the data lines. Also, the display panel may include an array substrate including a thin film transistor (TFT) which is a switching element for adjusting a light transmittance of each of the plurality of pixels, an upper substrate including a color filter and/or a black matrix, and a liquid crystal layer between the array substrate and the upper substrate.

Moreover, if the display panel is the organic light emitting display panel, the display panel may include a plurality of gate lines, a plurality of data lines, and a plurality of pixels respectively provided in a plurality of pixel areas defined by intersections of the gate lines and the data lines. Also, the display panel may include an array substrate including a TFT which is an element for selectively applying a voltage to each of the pixels, an organic light emitting device layer on the array substrate, and an encapsulation substrate disposed on the array substrate to cover the organic light emitting device layer. The encapsulation substrate may protect the TFT and the organic light emitting device layer from an external impact and may prevent water or oxygen from penetrating into the organic light emitting device layer. Also, a layer provided on the array substrate may include an inorganic light emitting layer (for example, a nano-sized material layer, a quantum dot, or the like).

Moreover, the display panel may further include a backing such as a metal plate attached on the display panel. However, the present embodiment is not limited to the metal plate, and the display panel may include another structure.

In the present disclosure, the display panel may be implemented at as a user interface module in a vehicle, such as at the central control panel area in an automobile. For example, such as a display panel can be configured to between two front seat occupants such that sounds due to vibrations of the display panel propagate towards the interior of the vehicle. As such, the audio experience within a vehicle can be improved when compared to having speakers only at the interior sides in the vehicle.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

Figure 1B:
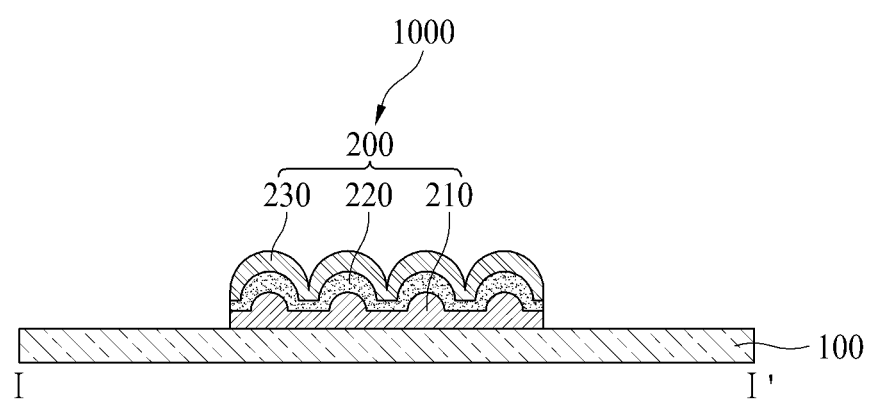
FIG. 1B is a cross-sectional view taken along line I-I' of FIG. 1A.

FIG. 1A is a diagram illustrating a display apparatus according to an embodiment of the present disclosure, and FIG. 1B is a cross-sectional view taken along line I-I' of FIG. 1A.

Referring to FIGS. 1A and 1B, the display apparatus may include a display panel 100 and a sound output unit 1000.

The display panel 100 may display an image and may be implemented as all types of display panels such as a liquid crystal display panel, an organic light emitting diode (OLED) display panel, an electroluminescent display panel, etc.

The sound output unit 1000 may include at least one sound module 200 which is disposed to overlap the display panel 100. The sound output module 200 may have transparency and may be disposed on a portion of a front surface or a rear surface of the display panel 100. The sound output module 200 may be attached on the front surface or the rear surface of the display panel 100 and may have transparency for transmitting an image displayed by the display panel 100. Therefore, the sound output module 200 may be formed of a material having an excellent light transmittance and may transmit the image displayed by the display panel 100. The sound output module 200 may vibrate based on a frequency input to output a sound. If the sound output module 200 is provided in plurality of sound output module, the plurality of sound output modules 200 may be spaced apart from one another and may have different sound characteristics. A sound characteristic of the sound output module 200 may be determined based on a shape, a size, a material, and an input frequency.

The sound output module 200 may include a support plate 210, an adhesive member 220, and a piezoelectric element 230.

The support plate 210 may include an uneven surface. For example, the support plate 210 may protrude or may be recessed, and thus, may include the uneven surface. The support plate 210 may be disposed in a lowermost portion of the sound output module 200 and may have transparency for transmitting the image displayed by the display panel 100. According to an embodiment, the support plate 210 may include a plurality of protrusion patterns and an even surface. The plurality of protrusion patterns may protrude from the even surface and may each become a source which allows the sound output module 200 to output a sound. For example, the sound output module 200 may have a winding shape at a position of each of the plurality of protrusion patterns and may output a sound through the piezoelectric element 230 which has a winding shape. The plurality of protrusion patterns may be formed as one body with the support plate 210, or after the support plate 210 is first formed, the plurality of protrusion patterns may be formed through a subsequent process.

The support plate 210 may allow the piezoelectric element 230 to have a winding shape through the plurality of protrusion patterns and may amplify a vibration of a front surface of the piezoelectric element 230. For example, the piezoelectric element 230 may be attached on the support plate 210 including the plurality of protrusion patterns and may have a winding shape, and the front surface of the winding piezoelectric element 230 may output an amplified sound.

The adhesive member 220 may be disposed on the support plate 210 and may have transparency for transmitting the image displayed by the display panel 100. The adhesive member 220 may attach a front surface of the support plate 210 on a rear surface of the piezoelectric element 230. An adhesive force of the adhesive member 220 may be adjusted based on a shape, a size, a material, a position, and a sound characteristic of the piezoelectric element 230. According to an embodiment, the adhesive member 220 may be formed of a clear adhesive material having an excellent light transmittance. For example, the adhesive member 220 may be an adhesive film, an optically clear adhesive (OCA) film, an optically clear resin (OCR), a pressure sensitive adhesive film, or the like.

The adhesive member 220 may have a winding shape by the uneven surface of the support plate 210. For example, the adhesive member 220 may be attached on the plurality of protrusion patterns and an even surface of the support plate 210. For example, a winding shape of the adhesive member 220 may be formed based on a shape, a size, and a position of each of the plurality of protrusion patterns of the support plate 210.

The adhesive member 220 may absorb vibration occurring in the rear surface of the piezoelectric element 230. For example, the adhesive member 220 may absorb the vibration occurring in the rear surface of the piezoelectric element 230, perform control in order for a sound to be output in a direction toward a front surface of the display panel 100, and amplify vibration occurring in a front surface of the piezoelectric element 230. The adhesive member 220 may absorb the vibration occurring in the rear surface of the piezoelectric element 230 in order for the display apparatus to output a sound having a straight characteristic within an audible frequency domain.

The piezoelectric element 230 may be attached on the uneven surface of the support plate 210 using the adhesive member 220. The piezoelectric element 230 may be attached on a front surface of the support plate 210 and may have transparency for transmitting the image displayed by the display panel 100. The piezoelectric element 230 may be formed of a material having an excellent light transmittance and may transmit the image displayed by the display panel 100. The piezoelectric element 230 may vibrate based on an input frequency to output a sound in an audible frequency domain.

The piezoelectric element 230 may have a winding shape by the uneven surface of the support plate 210. The piezoelectric element 230 may have a shape corresponding to the uneven surface of the support plate 210. For example, the piezoelectric element 230 may have an indented shape. Further, for example, the piezoelectric element 230 may be attached on the plurality of protrusion patterns and the even surface of the support plate 210 using the adhesive member 220, and thus, may have a winding shape. The winding piezoelectric element 230 may be provided, and thus, may synthesize frequencies of output sounds to control a directionality of the output sound. This will be described with reference to FIG. 11.

Moreover, indentions of the piezoelectric element 230 may be formed based on a shape, a size, and a position of each of the plurality of protrusion patterns of the support plate 210. The piezoelectric element 230 may be attached on the support plate 210, and thus, may be stably supported and fixed to have a winding shape. Therefore, the winding shape of the piezoelectric element 230 may be stably maintained or preserved despite an external force or other impacts.

The piezoelectric element 230 may absorb a vibration of the rear surface through the adhesive member 220, and a vibration of the front surface of the piezoelectric element 230 may be amplified by the plurality of protrusion patterns of the support plate 210. The piezoelectric element 230 is enhanced by the plurality of protrusion patterns of the support plate 210 and the adhesive member 220.

The piezoelectric element 230 may include a vibration layer, a first electrode, and a second electrode. The vibration layer may have transparency and may output a sound, based on vibration due to deformation. For example, the vibration layer may vibrate through expansion and contraction to output a sound.

Here, the piezoelectric element 230 may be an element having properties (i.e., a piezoelectric effect) where when an external force is applied, electrical polarization occurs to cause a potential difference, but when a voltage is applied, deformation or stress occurs. According to an embodiment, the piezoelectric element 230 may be formed of crystal, tourmaline, Rochelle salt, barium titanate ($BaTiO_3$), mono-ammonium phosphate ($NH_4H_2PO_4$), piezoelectric ceramic, and/or the like.

And, the piezoelectric element 230 may be formed of an insulation elastic material, such as silicon, acryl, or urethane, or a piezoelectric polymer material such as poly vinylidene fluoride (PVDF) or PZT (lead zirconate titanate; a generic name for zirconate $PbZrO_3$ and titanate $PbTiO_3$). PVDF may include polyvinylidene fluoride trifluoroethylene (PVDF-TrFE) and may have a characteristic which is easy to manufacture in a flexible film form.

The vibration layer may be transparent and may have a certain thickness and length. The first electrode may be disposed between the front surface of the support plate 210 and one surface of the vibration layer, and the second electrode may be disposed on the other surface of the vibration layer opposite to the one surface of the vibration layer. For example, the first and second electrodes may be attached on both surfaces of the vibration layer and may be supplied with a voltage from an external circuit. When a voltage is applied to a transparent electrode, the sound output module 200 may vibrate based on an electrical field due to an inverse piezoelectric effect. For example, the display apparatus may control the voltage applied to the sound output module 200 to control a vibration (or an output of a sound) of the sound output module 200.

The vibration layer may be deformed in at least one of a thickness direction and a lengthwise direction according to a sound signal applied to the first and second electrodes and may output a sound using the vibration due to the deformation. In detail, the vibration layer may expand and contract in at least one of the thickness direction and the lengthwise direction to vibrate, thereby outputting the sound.

In the display apparatus according to the present embodiment, since the at least one sound output module 200 is attached on the front surface or the rear surface of the display panel 100, an output position of an image displayed by the display panel 100 may be matched with or adjusted an output position of a sound output through the sound output module 200, thereby enhancing a sense of reality and an immersion of a viewer who is watching an image. Also, in the display apparatus according to the present embodiment, since the sound output module 200 including the winding piezoelectric element 230 is provided, a directionality of an output sound may be controlled by synthesizing frequencies of output sounds, thereby enhancing a sense of reality and immersion. And, in the display apparatus according to the present embodiment, since the sound output module 200 is attached on the front surface or the rear surface of the display panel 100, a speaker is not separately provided, and thus, a degree of freedom in speaker disposition or arrangement is enhanced and an aesthetic design appearance of a set device or a set apparatus is enhanced.

Figure 2A:
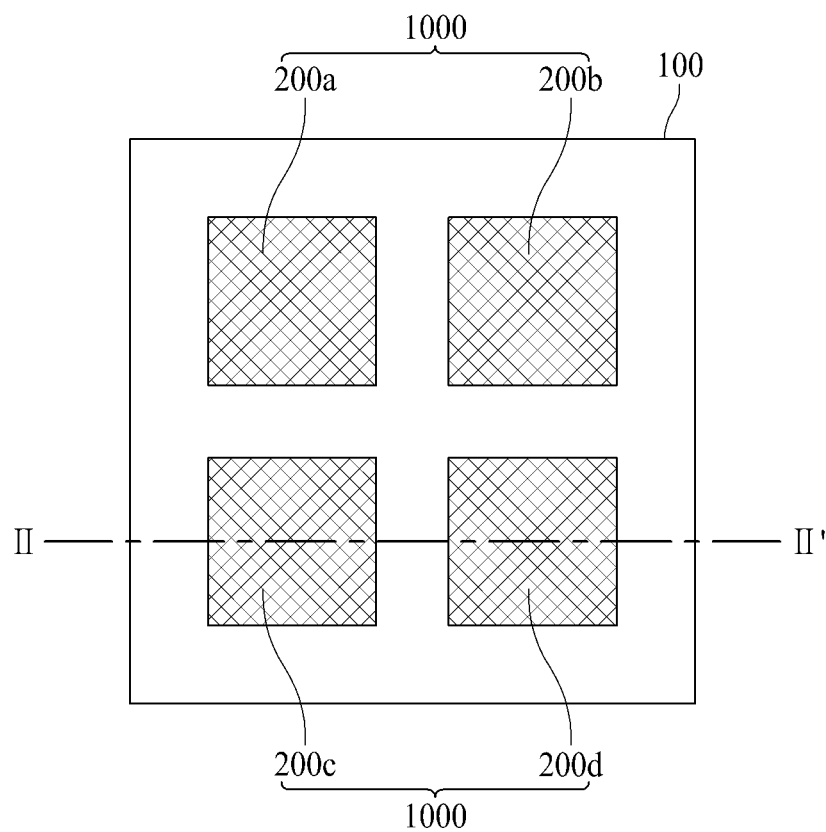
FIG. 2A is a plan view illustrating a display apparatus according to a first embodiment of the present disclosure.
Figure 2B:
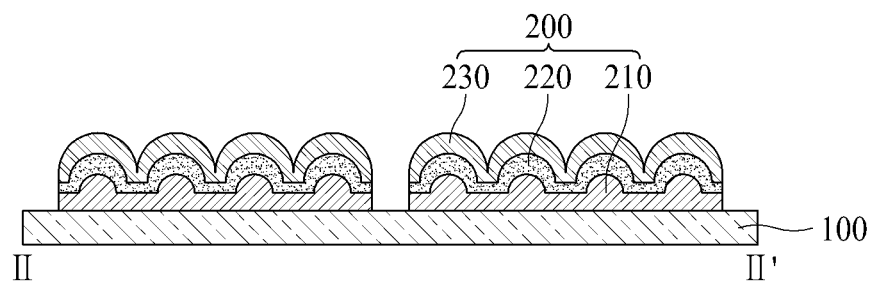
FIG. 2B is a cross-sectional view taken along line II-II' of FIG. 2A.

FIG. 2A is a plan view illustrating a display apparatus according to a first embodiment of the present disclosure, and FIG. 2B is a cross-sectional view taken along line II-IF of FIG. 2A.

Referring to FIGS. 2A and 2B, the sound output unit 1000 may include a plurality of sound output modules 200 and may be disposed on the front surface of the display panel 100. The plurality of sound output modules 200 may be provided by a necessary number, for improving a sound characteristic of the display apparatus.

The plurality of sound output modules 200 may be spaced apart from one another, and each of the plurality of sound output modules 200 may be independently driven according to an input frequency corresponding thereto. Each of the plurality of sound output modules 200 may be provided or not with the input frequency so as to output a sound corresponding to an image displayed by the display panel 100. For example, the display apparatus may select a sound output module 200, through which the sound corresponding to the image displayed by the display panel 100 is to be output, from among the plurality of sound output modules 200 and may provide the frequency input to the selected sound output module 200. Accordingly, each of the sound output modules 200 may be driven based on a sound source for an image, and thus, a sense of reality of a sound output in the sound source for the image is enhanced.

According to an embodiment, the sound output unit 1000 may include four sound output modules 200, and the four sound output modules 200a to 200d may be respectively disposed on both sides of upper and lower sides of the display panel 100. For example, the four sound output modules 200 may be respectively disposed in an upper left region, an upper right region, a lower left region, and a lower right region of the display panel 100. A sound output module 200a disposed in the upper left region of the display panel 100 may be driven when a sound source (for example, a person, an animal, a machine including a speaker, or an object generating a sound) in an image displayed by the display panel 100 is disposed in the upper left region. Also, a sound output module 200b disposed in the upper right region of the display panel 100 may be driven when a sound source in the image displayed by the display panel 100 is disposed in the upper right region. The piezoelectric element 230 disposed in each of a lower left region 200c and a lower right region 200d of the display panel 100 may also be driven based on a positon of a sound source in the image displayed by the display panel 100.

As the number of the sound output modules 200 increases, a position of a sound output from the display apparatus may be more accurately matched with a position of a sound source for an image displayed by the display panel 100, and thus, a sense of reality felt by a viewer watching the image is more enhanced. As a result, the number, sizes, and positions of the sound output modules 200 may be adjusted for maximally enhancing a sound characteristic without needing the excessive cost.

Figure 3:
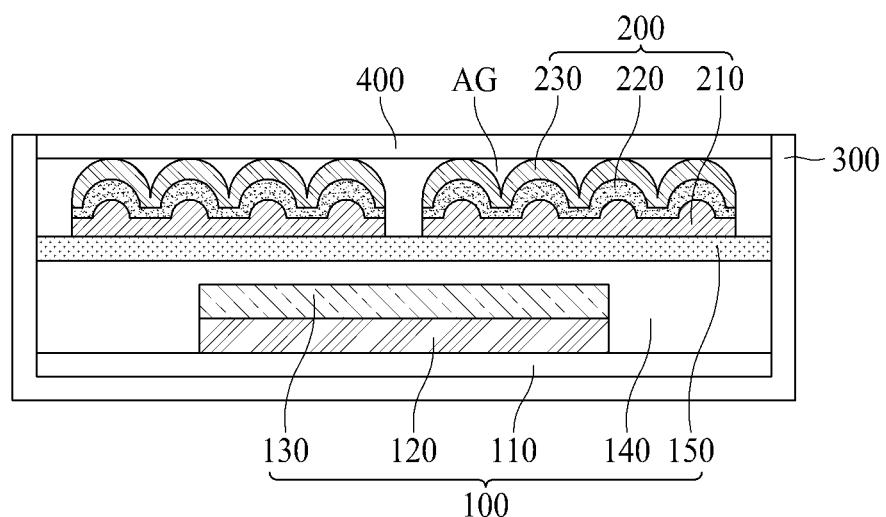
FIG. 3 is a cross-sectional view illustrating the display apparatus according to the first embodiment of the present disclosure.

FIG. 3 is a cross-sectional view illustrating the display apparatus according to the first embodiment of the present disclosure.

Referring to FIG. 3, the display panel 100 may include a base substrate 110, a TFT layer 120, a light emitting device layer 130, an adhesive layer 140, and an encapsulation plate 150. Here, the TFT layer 120 and the light emitting device layer 130 may be referred to as a pixel array layer.

The base substrate 110 may include a plastic material, a glass material, and/or the like. Here, if the base substrate 110 includes a plastic material, the base substrate 110 may include opaque or colored polyimide material. For example, the base substrate 110 including polyimide material may be formed by curing a polyimide resin which is coated to have a certain thickness on a front surface of a release layer disposed on a carrier substrate which is relatively thick. In this case, the carrier substrate may be separated from the base substrate 110 by releasing the release layer through a laser release process.

Additionally, if the base substrate 110 includes a plastic material, the display apparatus according to the present embodiment may further include a back plate connected to a rear surface of the base substrate 110 with respect to a thickness direction of the base substrate 110. The back plate may maintain the base substrate 110 in a plane state. According to an embodiment, the back plate may include a plastic material, polyethylene terephthalate (PET), and/or the like. The back plate may be laminated on the rear surface of the base substrate 110 separated from the carrier substrate.

The TFT layer 120 may be disposed in a partial region on the base substrate 110 and may include a plurality of scan lines, a plurality of data lines, and a plurality of TFTs. Each of the TFTs may include a gate electrode, a semiconductor layer, a source electrode, and a drain electrode.

The light emitting device layer 130 may be disposed on the TFT layer 120. According to an embodiment, the light emitting device layer 130 may include a first electrode, a light emitting layer, a second electrode, and a bank. A plurality of pixels may be provided in an area where the light emitting device layer 130 is provided, and thus, the area where the light emitting device layer 130 is provided may be referred to as a display area. A peripheral area of the display area may be referred to as a non-display area. The light emitting device layer 130 may emit light according to a data signal supplied from the TFT of the TFT layer 120 through the first electrode. At this time, light emitted from the light emitting device layer 130 may be extracted toward the encapsulation plate 150.

According to an embodiment, the plurality of pixels may be arranged in a stripe structure in the display area. In this case, each of the plurality of pixels may include a red subpixel, a green subpixel, and a blue subpixel, and moreover, may further include a white subpixel.

According to another embodiment, the plurality of pixels may be arranged in a pentile structure in the display area. In this case, each of the plurality of pixels may include one red subpixel, two green subpixels, and one blue subpixel, which are planarly arranged as a polygonal type. For example, each of the pixels having the pentile structure may include one red subpixel, two green subpixels, and one blue subpixel, which are planarly arranged as an octagonal type. In this case, the blue subpixel may have a largest size, and each of the two green subpixels may have a smallest size.

The adhesive layer 140 may be disposed to surround the TFT layer 120 and the light emitting device layer 130 (hereinafter referred to as a pixel array layer). The adhesive layer 140 may seal the pixel array layer 120 and 130 and may attach the encapsulation plate 150 on the base substrate 110 on which the pixel array layer 120 and 130 is disposed. The adhesive layer 140 may be an OCA film, an OCR, or the like.

The encapsulation plate 150 may act as a cover substrate or a cover window, which covers the base substrate 110 and the pixel array layer 120 and 130. The encapsulation plate 150 prevents oxygen or moisture from penetrating into the pixel array layer 120 and 130. According to an embodiment, the encapsulation plate 150 may include at least one inorganic layer. The inorganic layer may be formed of at least one of silicon nitride, aluminum nitride, zirconium nitride, titanium nitride, hafnium nitride, tantalum nitride, silicon oxide, aluminum oxide, and titanium oxide.

According to an embodiment, the display panel 100 may display an image in a type such as a top emission type or a bottom emission type, based on a structure of the pixel array layer 120 and 130 including an anode electrode, a cathode electrode, and an organic compound layer. In the top emission type, visible light emitted from the pixel array layer 120 and 130 may be irradiated toward the encapsulation plate 150, and in the bottom emission type, the visible light emitted from the pixel array layer 120 and 130 may be irradiated toward the base substrate 110.

In the first embodiment of the present disclosure, as illustrated in FIG. 3, the display panel 100 may be implemented as the top emission type, but is not limited thereto. In other embodiments, the display panel 100 may be implemented as the bottom emission type or a dual emission type, in addition to the top emission type.

If the display panel 100 is implemented as the top emission type as illustrated in FIG. 3, a support plate 210 of a sound output module 200 may be disposed on the display panel 100. For example, the adhesive member 220 may absorb a vibration, occurring based on an input frequency, of a rear surface of the piezoelectric element 230 to minimize vibration transferred to the display panel 100. Also, the piezoelectric element 230 may be attached on the support plate 210 including a plurality of protrusion patterns and having a winding shape, and a front surface of the winding piezoelectric element 230 may output an amplified sound in the same direction as a direction in which the visible light is irradiated.

The display apparatus may further include a back cover 300 which accommodates the display panel 100. The back cover 300 may support at least one of a rear surface or a side surface of the display panel 100. The back cover 300 may surround a whole side surface and rear surface of the display apparatus, thereby protecting the display apparatus. According to an embodiment, the back cover 300 may include a base frame and a plurality of sidewalls. The back cover 300 may surround the rear surface of the display apparatus by using the base frame and may surround the side surface of the display apparatus by using the plurality of sidewalls. The back cover 300 may have rigidity which is relatively stronger than weight. Accordingly, the back cover 300 efficiently protects the display apparatus without causing a large increase in weight of the display apparatus. The back cover 300 may be designed based on a shape of the display apparatus, and a design may be included in a surface of the back cover 300.

The display apparatus according to the present embodiment may further include a protection member 400 which is disposed on a sound output unit 1000 to protect the sound output unit 1000. The protection member 400 may be disposed on the sound output module 200 to protect the display panel 100 and the sound output module 200 from an external physical impact. In detail, the protection member 400 may be attached on the sound output module 200 to prevent the damage and malfunction of the display apparatus. Also, the protection member 400 protects pressure and a high temperature as well as the external physical impact. According to an embodiment, the protection member 400 may be formed of tempered glass.

According to an embodiment, the protection member 400 may be attached on the sound output module 200 and may vibrate based on a vibration of the sound output module 200 which is provided in plurality. Only a corresponding region of the protection member 400 may vibrate based on the vibration of each of the plurality of sound output modules 200. For example, the protection member 400 may be formed of a flexible material so that only a region where a vibrating sound output module 200 is disposed vibrates. The protection member 400 may protect the display apparatus, and moreover, may act as a vibration plate.

An air gap AG may be provided between the protection member 400 and the sound output modules 200. The air gap AG may transfer a vibration of a portion, unattached on the protection member 400, of the sound output module 200 to the protection member 400. For example, a vibration of a portion, attached on the protection member 400, of the sound output module 200 may be directly transferred to the protection member 400, and a vibration of a portion, unattached on the protection member 400, of the sound output module 200 may be transferred to the protection member 400 through the air gap AG. Accordingly, in the display apparatus according to the present embodiment, the air gap AG may be provided between the sound output module 200 and the protection member 400, thereby enhancing the transfer of vibration from the sound output module 200, increasing amplitude of a sound, and enhancing a sound characteristic.

Figure 4:
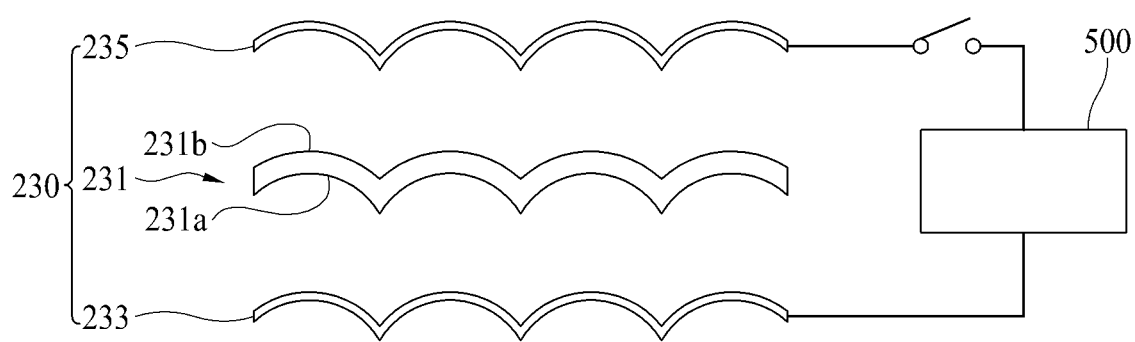
FIG. 4 is a diagram for describing a driving circuit unit for driving a sound output module, in the display apparatus according to the first embodiment of the present disclosure.

FIG. 4 is a diagram for describing a driving circuit unit for driving the sound output module, in the display apparatus according to the first embodiment of the present disclosure.

The piezoelectric element 230 may include a vibration layer 231, a first electrode 233, and a second electrode 235. The vibration layer 231 may have transparency and may output a sound by using vibration due to deformation. In detail, the vibration layer 231 may be deformed in at least one of a thickness direction and a lengthwise direction according to a sound signal applied to the first and second electrodes 233 and 235 and may output a sound using the vibration due to the deformation. In detail, the vibration layer 231 may expand and contract in at least one of the thickness direction and the lengthwise direction to vibrate, thereby outputting the sound. The vibration layer 231 may be transparent and may have a certain thickness and length.

The first electrode 233 may be disposed between the front surface of the support plate 210 and one surface 231a of the vibration layer 231, and the second electrode 235 may be disposed on another surface 231b of the vibration layer 231 opposite to the one surface 231a of the vibration layer 231. For example, the first and second electrodes 233 and 235 may be attached on both surfaces of the vibration layer 231. When a voltage is applied to the first and second electrodes 233 and 235, the vibration layer 231 may vibrate based on an electrical field due to an inverse piezoelectric effect. For example, the display apparatus according to the present embodiment may control the voltage applied to the sound output module 200 to control a vibration (or an output of a sound) of the sound output module 200.

The display apparatus according to the present embodiment may further include a driving circuit unit 500 which provides an input frequency to the at least one sound output module 200. According to an embodiment, the at least one sound output module 200 may include a plurality of sound output modules 200. The driving circuit unit 500 may be connected to each of the plurality of sound output modules 200 and may provide the input frequency to a sound output module 200 requiring a sound output. In detail, the driving circuit unit 500 may independently control a plurality of sound output modules respectively disposed in a plurality of regions of the front surface or the rear surface of the display panel 100, based on an image which is to be displayed by the display panel 100. The driving circuit unit 500 may select a sound output module 200 for outputting a sound corresponding to the image displayed by the display panel 100 and may provide the input frequency in order for the selected sound output module 200 to output the sound corresponding to the image.

The driving circuit unit 500 may include a controller and a driver. The controller may extract sound data and sound position data, based on image input data displayed by the display panel 100. Here, the sound data may include frequency band information about a sound, and the sound position data may include position information about a sound source in the image displayed by the display panel 100. The driver may generate a sound signal, based on the sound data and may provide the sound signal to a sound output module 200, corresponding to the sound position data, of the plurality of sound output modules 200.

According to an embodiment, the driving circuit unit 500 may receive the position information (or the sound position data) about the sound source (for example, a person or a machine including a speaker) in the image displayed by the display panel 100. The driving circuit unit 500 may select a sound output module 200 which is to be driven, based on the received position information. For example, as in FIG. 2A, the display apparatus according to the present embodiment may include four sound output modules 200a to 200d, and if the sound source is located on the left in the image displayed by the display panel 100, the driving circuit unit 500 may receive the position information about the sound source may select the sound output modules 200a and 200c located on the left. For example, the driving circuit unit 500 may provide the frequency input to the sound output modules 200a and 200c located on the left and may not provide the frequency input to the sound output modules 200b and 200d located on the right. Accordingly, a viewer watching the image feels a sense of reality as if the sound source in the image displayed by the display panel 100 outputs a sound directly.

Figure 5:
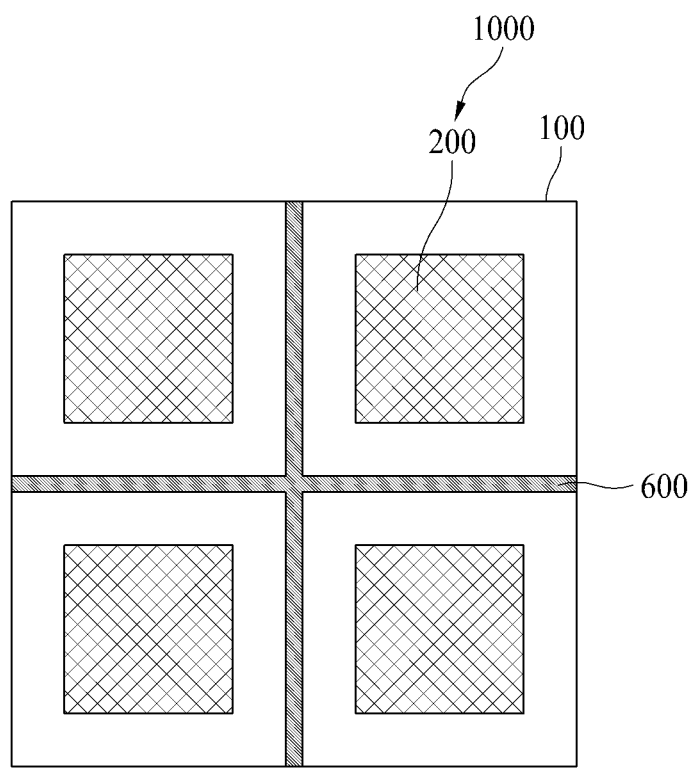
FIG. 5 is a diagram for describing a partition between a plurality of sound output modules, in the display apparatus according to the first embodiment of the present disclosure.

FIG. 5 is a diagram for describing a partition between a plurality of sound output modules, in the display apparatus according to the first embodiment of the present disclosure.

Referring to FIG. 5, in a case where the sound output unit 1000 include the plurality of sound output modules 200, the display apparatus according to the present embodiment may further include a partition 600 which divides the plurality of sound output modules 200. In detail, the partition 600 may be disposed to divide the plurality of sound output modules 200, for preventing interference of a sound output from each of the plurality of sound output modules 200. According to an embodiment, the partition 600 may correspond to an air gap AG or a space which absorbs a sound occurring when each of the plurality of sound output modules 200 vibrates. Also, the partition 600 may correspond to an enclosure or a baffle, but the term is not limited thereto.

The partition 600 may separate sounds respectively output from the plurality of sound output modules 200. The partition 600 may attenuate or absorb a vibration of each of the plurality of sound output modules 200, thereby preventing a sound output from each of the plurality of sound output modules 200 from being transferred to a space corresponding to another sound. Accordingly, the partition 600 may separate the sounds respectively output from the plurality of sound output modules 200, thereby enhancing a sound output characteristic of the display apparatus.

According to an embodiment, the partition 600 may be formed of polyurethane or polyolefin, but is not limited thereto. Also, the partition 600 may be implemented with a single-sided tape or a double-sided tape and may have elasticity to be compressible to a certain extent.

Moreover, the partition 600 is not limited to the first embodiment of the present disclosure and may be applied to all embodiments including a second embodiment and a third embodiment of the present disclosure. Hereinafter, a description of the partition 600 is omitted so as not to repeat repetitive descriptions.

Figure 6A:
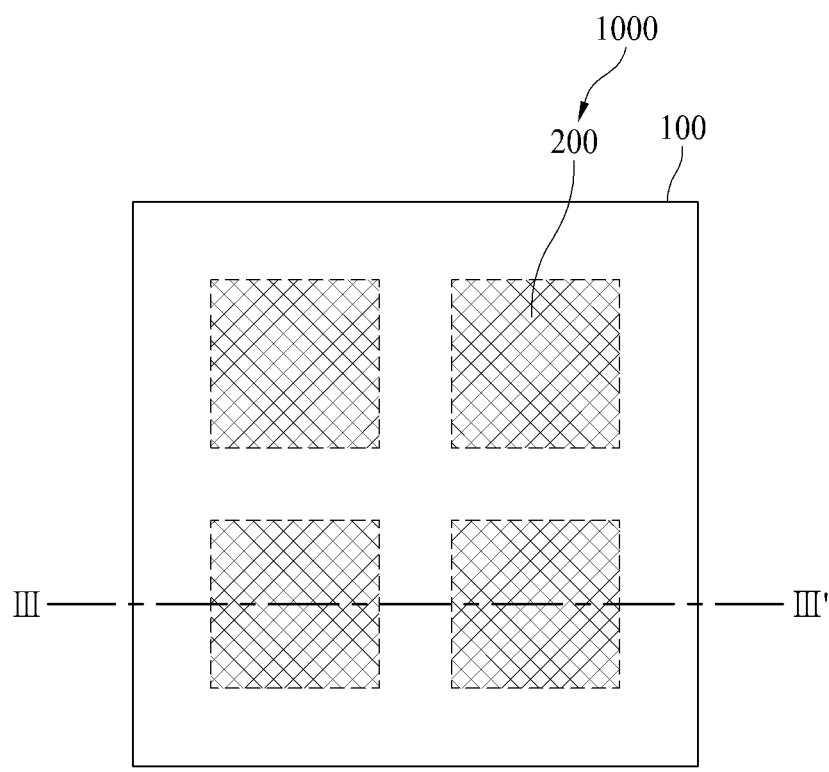
FIG. 6A is a plan view illustrating a display apparatus according to a second embodiment of the present disclosure.
Figure 6B:
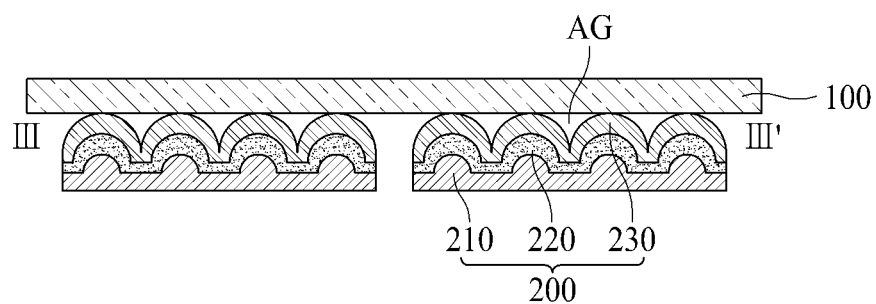
FIG. 6B is a cross-sectional view taken along line of FIG. 6A.

FIG. 6A is a plan view illustrating a display apparatus according to a second embodiment of the present disclosure, and FIG. 6B is a cross-sectional view taken along line of FIG. 6A.

Referring to FIGS. 6A and 6B, a sound output unit 1000 may include a plurality of sound output modules 200 and may be disposed on a rear surface of a display panel 100. According to an embodiment, the sound output unit 1000 may be disposed between the display panel 100 and a back cover. The plurality of sound output modules 200 may be provided by a necessary number, for improving a sound output characteristic of the display apparatus. Hereinafter, in describing the second embodiment of the present disclosure, only a difference between the second embodiment of the present disclosure and the first embodiment of the present disclosure will be described, and the same elements are omitted or will be briefly described.

The sound output module 200 may include a support plate 210, an adhesive member 220, and a piezoelectric element 230. The support plate 210 may be disposed in a lowermost portion of the sound output module 200 and may include an uneven surface. The support plate 210 may have transparency for transmitting an image displayed by the display panel 100. According to an embodiment, the support plate 210 may include a plurality of protrusion patterns and an even surface.

The adhesive member 220 may be disposed on the support plate 210 and may be attached on the plurality of protrusion patterns and the even surface, and thus, may have a winding shape. The adhesive member 220 may have transparency for transmitting an image displayed by the display panel 100.

The piezoelectric element 230 may be attached on the uneven surface of the support plate 210 using the adhesive member 220. The piezoelectric element 230 may be disposed in the adhesive member 220 and may be attached on the plurality of protrusion patterns and the even surface of the support plate 210 using the adhesive member 220, and thus, may have a winding shape. The piezoelectric element 230 may have transparency for transmitting the image displayed by the display panel 100.

The display panel 100 may be disposed (or the piezoelectric element 230) on the sound output module 200. According to an embodiment, the display panel 100 may be attached on the sound output module 200 and may vibrate based on a vibration of the sound output module 200. Only a corresponding region of the display panel 100 may vibrate based on the vibration of each of the plurality of sound output modules 200. For example, the display panel 100 may be formed of a flexible material so that only a corresponding region where a vibrating sound output module 200 is disposed vibrates. The display panel 100 may display an image, and moreover, may act as a vibration plate.

An air gap AG may be provided between the display panel 100 and the sound output modules 200. The air gap AG may transfer a vibration of a portion, unattached on the display panel 100, of the sound output module 200 to the display panel 100. For example, a vibration of a portion, attached on the display panel 100, of the sound output module 200 may be directly transferred to the display panel 100, and a vibration of a portion, unattached on the display panel 100, of the sound output module 200 may be transferred to the display panel 100 through the air gap AG. Accordingly, in the display apparatus according to the present embodiment, the air gap AG may be provided between the sound output module 200 and the display panel 100, thereby enhancing the transfer of vibration from the sound output module 200, increasing amplitude of a sound, and enhancing a sound output characteristic.

Figure 7:
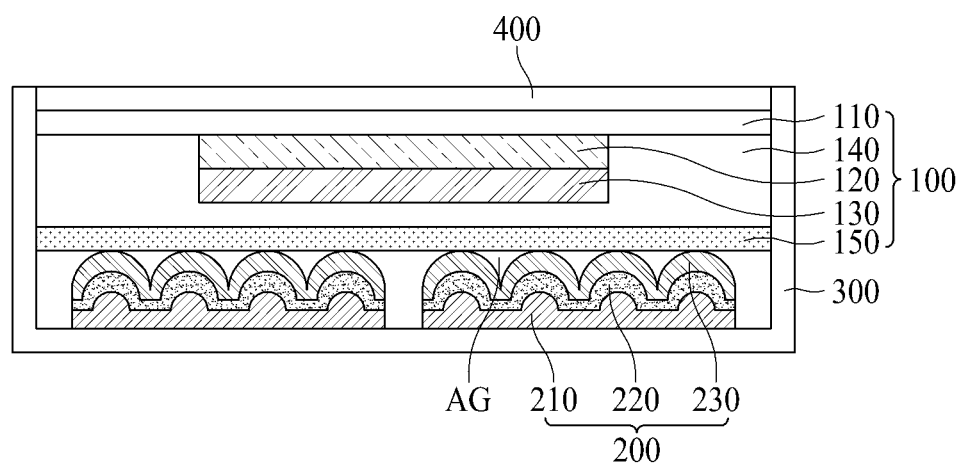
FIG. 7 is a cross-sectional view illustrating the display apparatus according to the second embodiment of the present disclosure.

FIG. 7 is a cross-sectional view illustrating the display apparatus according to the second embodiment of the present disclosure.

Referring to FIG. 7, the display panel 100 may include a base substrate 110, a TFT layer 120, a light emitting device layer 130, an adhesive layer 140, and an encapsulation plate 150. Here, the TFT layer 120 and the light emitting device layer 130 may be referred to as a pixel array layer.

The TFT layer 120 may be disposed in a partial region on the base substrate 110 and may include a plurality of scan lines, a plurality of data lines, and a plurality of TFTs. Each of the TFTs may include a gate electrode, a semiconductor layer, a source electrode, and a drain electrode.

The light emitting device layer 130 may be disposed on the TFT layer 120. According to an embodiment, the light emitting device layer 130 may include a first electrode, a light emitting layer, a second electrode, and a bank. A plurality of pixels may be provided in an area where the light emitting device layer 130 is provided, and thus, the area where the light emitting device layer 130 is provided may be referred to as a display area.

The adhesive layer 140 may be disposed to surround the TFT layer 120 and the light emitting device layer 130 (hereinafter referred to as a pixel array layer). The adhesive layer 140 may seal the pixel array layer 120 and 130 and may attach the encapsulation plate 150 on the base substrate 110 on which the pixel array layer 120 and 130 is disposed.

The encapsulation plate 150 may act as a cover substrate or a cover window, which covers the base substrate 110. The encapsulation plate 150 prevents oxygen or moisture from penetrating into the pixel array layer 120 and 130.

According to an embodiment, the display panel 100 may display an image in a type such as a top emission type or a bottom emission type, based on a structure of the pixel array layer 120 and 130 including an anode electrode, a cathode electrode, and an organic compound layer. In the top emission type, visible light emitted from the pixel array layer 120 and 130 may be emitted toward the encapsulation plate 150, and in the bottom emission type, the visible light emitted from the pixel array layer 120 and 130 may be emitted toward the base substrate 110.

In the second embodiment of the present disclosure, as illustrated in FIG. 7, the display panel 100 may be implemented as the top emission type, but is not limited thereto. In other embodiments, the display panel 100 may be implemented as the bottom emission type or a dual emission type, in addition to the top emission type.

If the display panel 100 is implemented as the bottom emission type, the encapsulation plate 150 of the display panel 100 may be disposed on the piezoelectric element 230. For example, a vibration of the piezoelectric element 230 occurring based on an input frequency may be transferred to the display panel 100 through the encapsulation plate 150. Also, the piezoelectric element 230 may be attached on the support plate 210 including a plurality of protrusion patterns and having a winding shape, and a front surface of the winding piezoelectric element 230 may amplify vibration transferred to the encapsulation plate 150. The adhesive member 220 may absorb a vibration, occurring based on the input frequency, of a rear surface of the piezoelectric element 230 to minimize vibration transferred to the support plate 210.

The display apparatus according to the present embodiment may further include a protection member 400 which is disposed on the display panel 100 to protect the display panel 100. The protection member 400 may be attached on the display panel 100 to protect the display panel 100 from an external physical impact. In detail, the protection member 400 may be attached on the display panel 100 to prevent the damage and malfunction of the display apparatus. Also, the protection member 400 protects pressure and a high temperature as well as the external physical impact. According to an embodiment, the protection member 400 may be formed of tempered glass.

According to an embodiment, the protection member 400 may be attached on the display panel 100 and may vibrate based on a vibration of the display panel 100 which vibrates as one body with the sound output module 200. Only a corresponding region of the protection member 400 may vibrate based on the vibration of the display panel 100 receiving a vibration of each of the plurality of sound output modules 200. For example, the protection member 400 may be formed of a flexible material in order for only a region, where the display panel 100 vibrates, to vibrate. The protection member 400 may protect the display apparatus, and moreover, may act as a vibration plate.

Figure 8:
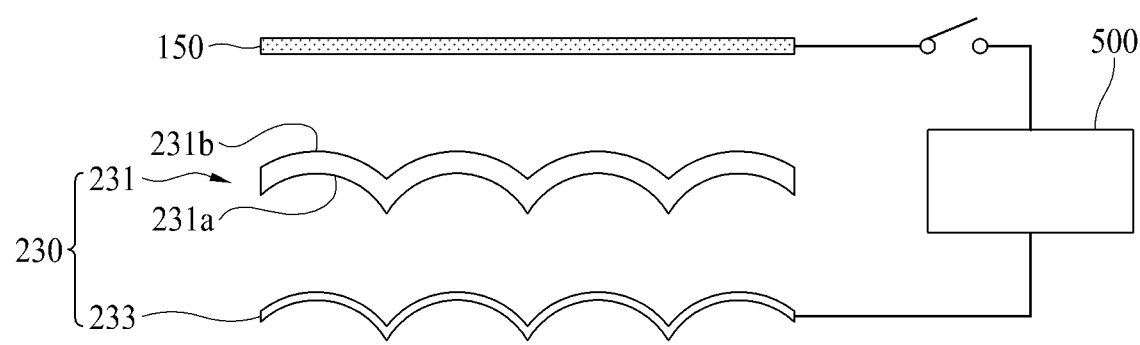
FIG. 8 is a diagram for describing a driving circuit unit for driving a sound output module, in the display apparatus according to the second embodiment of the present disclosure.

FIG. 8 is a diagram for describing a driving circuit unit for driving the sound output module, in the display apparatus according to the second embodiment of the present disclosure.

Referring to FIG. 8, the piezoelectric element 230 may include a vibration layer 231 and a first electrode 233. The vibration layer 231 may have transparency and may output a sound using vibration due to deformation. The vibration layer 213 may be disposed between the first electrode 233 and the encapsulation plate 150. The first electrode 233 may be disposed between a front surface of the support plate 210 and one surface 231a of the vibration layer 231. The first electrode 233 may be attached on the uneven surface of the support plate 210. Another surface 231b of the vibration layer 231 opposite to the one surface 231a of the vibration layer 231 may be attached on the encapsulation plate 150.

For example, the first electrode 233 and the encapsulation plate 150 may be attached on both surfaces of the vibration layer 231. The first electrode 233 and the encapsulation plate 150 may be supplied with a voltage from the driving circuit unit 500. When the voltage is applied to the first electrode 233 and the encapsulation plate 150, the vibration layer 231 may vibrate based on an electrical field due to an inverse piezoelectric effect. For example, the display apparatus according to the present embodiment may control the voltage applied to the sound output module 200 to control a vibration (or an output of a sound) of the sound output module 200.

Therefore, the encapsulation plate 150 may be used as a second electrode which applies a sound signal to the vibration layer 231 of the piezoelectric element 230. In detail, if the sound output module 200 is disposed on the rear surface of the display panel 100 and the display panel 100 is implemented as the bottom emission type, the piezoelectric element 230 may use the encapsulation plate 150 of the display panel 100 as the second electrode 235 without separately including the second electrode 235. In this case, in the display apparatus according to the present embodiment, since the second electrode 235 is omitted, a manufacturing process is simplified, and a thickness of the display apparatus is reduced.

According to an embodiment, the vibration layer 231 may be deformed in at least one of a thickness direction and a lengthwise direction according to a sound signal applied to the first electrode 233 and the encapsulation plate 150 and may output a sound using the vibration due to the deformation. In detail, the vibration layer 231 may expand and contract in at least one of the thickness direction and the lengthwise direction to vibrate, thereby outputting the sound. The vibration layer 231 may be transparent and may have a certain thickness and length.

Figure 9A:
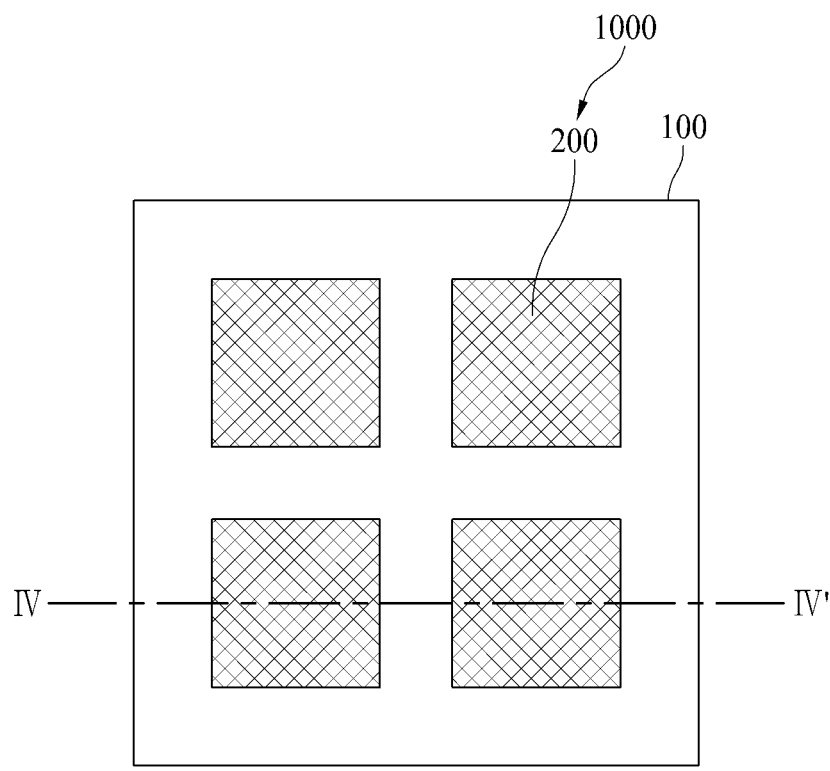
FIG. 9A is a plan view illustrating a display apparatus according to a third embodiment of the present disclosure.
Figure 9B:
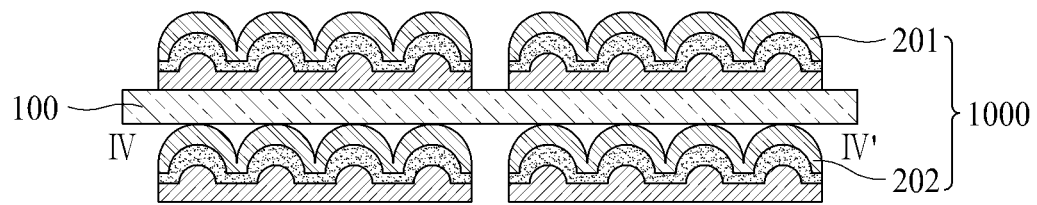
FIG. 9B is a cross-sectional view taken along line IV-IV' of FIG. 9A.

FIG. 9A is a plan view illustrating a display apparatus according to a third embodiment of the present disclosure, and FIG. 9B is a cross-sectional view taken along line IV-IV' of FIG. 9A.

Referring to FIGS. 9A and 9B, a sound output unit 1000 may include a first sound output unit 201 and a second sound output unit 202. The first sound output unit 201 may be disposed on a front surface of a display panel 100 and may include at least one sound output module 200. The second sound output unit 202 may be disposed between the display panel 100 and a back cover 300 and may include at least one sound output module 200. For example, the first sound output unit 201 may be attached on the front surface of the display panel 100, and the second sound output unit 202 may be attached on a rear surface of the display panel 100.

According to an embodiment, the first sound output unit 201 may overlap the display panel 100 in the same region as a region where the second sound output unit 202 overlaps the display panel 100. The first and second sound output units 201 and 202 may overlap the display panel 100 in the same region and may complement their vibrations. Also, since the first and second sound output units 201 and 202 overlap the display panel 100 in the same region, amplitude of a sound increases, and a sound characteristic is enhanced.

Figure 10A:
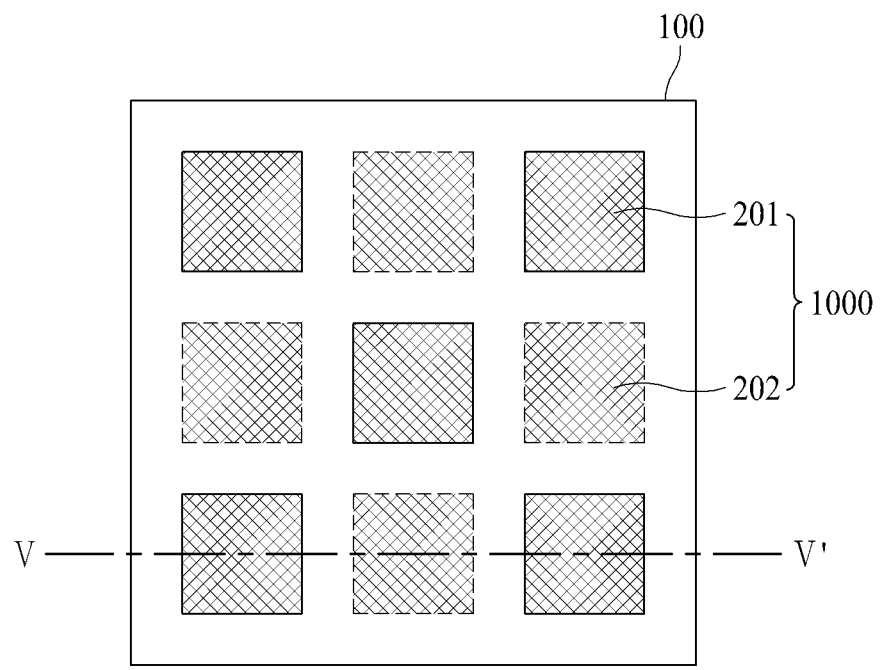
FIG. 10A is a plan view illustrating a display apparatus according to another example of the third embodiment of the present disclosure.
Figure 10B:
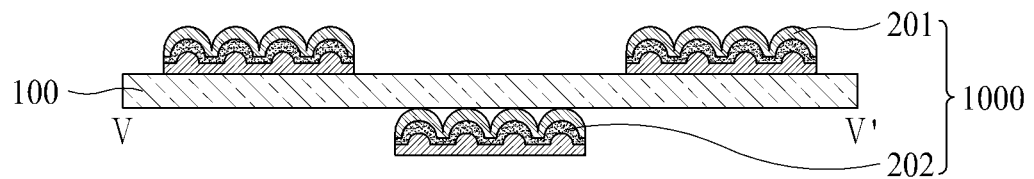
FIG. 10B is a cross-sectional view taken along line V-V' of FIG. 10A.

FIG. 10A is a plan view illustrating a display apparatus according to another example of the third embodiment of the present disclosure, and FIG. 10B is a cross-sectional view taken along line V-V' of FIG. 10A.

Referring to FIGS. 10A and 10B, a sound output unit 1000 may include a first sound output unit 201 and a second sound output unit 202. The first sound output unit 201 may be disposed on a front surface of a display panel 100 and may include at least one sound output module 200. The second sound output unit 202 may be disposed between the display panel 100 and a back cover 300 and may include at least one sound output module 200.

According to an embodiment, the first sound output unit 201 may overlap the display panel 100 in a region which differs from a region where the second sound output unit 202 overlaps the display panel 100. The first and second sound output units 201 and 202 may overlap the display panel 100 in different regions, thereby increasing a region which vibrates in the display panel 100. For example, since the first and second sound output units 201 and 202 overlap the display panel 100 in different regions, an output position of an image displayed by the display apparatus is maximally matched with an output position of a sound output from the display apparatus. Accordingly, since the first and second sound output units 201 and 202 overlap the display panel 100 in different regions, an output position of an image displayed by the display apparatus is matched with an output position of a sound output from the display apparatus, and a viewer's immersion is enhanced.

Figure 11:
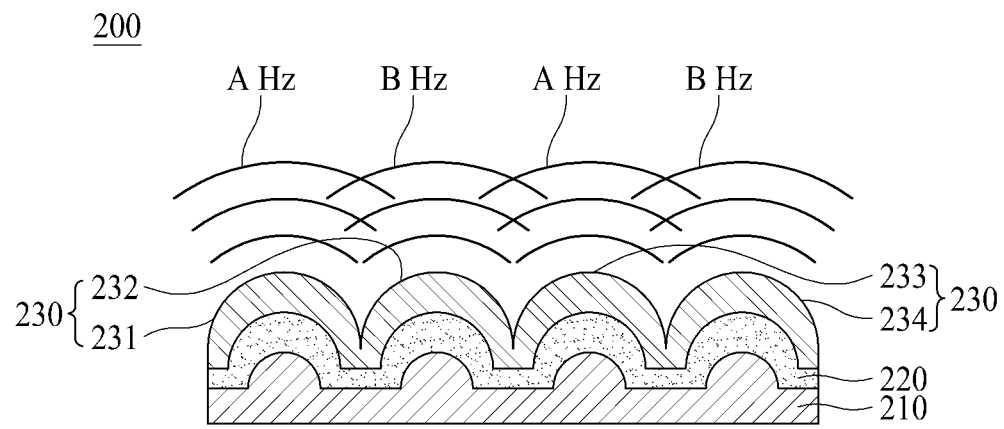
FIG. 11 is a diagram for describing the frequency synthesis of a sound output through a winding piezoelectric element, in a display apparatus according to an embodiment of the present disclosure.

FIG. 11 is a diagram for describing the frequency synthesis of a sound output through an winding piezoelectric element, in a display apparatus according to an embodiment of the present disclosure.

Referring to FIG. 11, a piezoelectric element 230 may be attached on a support plate 220 including a plurality of protrusion patterns and having a winding shape, and a front surface of the winding piezoelectric element 230 may output an amplified sound. The piezoelectric element 230 may be attached on a support plate 210 by using an adhesive member 220 which has a winding shape by an uneven surface of the support plate 210. Here, the adhesive member 220 may have transparency for transmitting an image displayed by the display panel 100. According to an embodiment, the winding piezoelectric element 230 may include a plurality of protrusions respectively corresponding to positions of the plurality of protrusion patterns. For example, the winding piezoelectric element 230 may include first to fourth protrusions 231 to 234. Here, the number of the protrusions 231 to 234 is not limited to four, and may be freely adjusted according to embodiments. A sound output module 200 may output a sound through each of the first to fourth protrusions 231 to 234 of the piezoelectric element 230.

According to an embodiment, each of the first to fourth protrusions 231 to 234 may output sounds having different frequencies. The piezoelectric element 230 may be provided with an input frequency from the driving circuit unit 500, in order for the first to fourth protrusions 231 to 234 to respectively output sounds having different frequencies.

According to an embodiment, a sound output frequency from each of the first to fourth protrusions 231 to 234 can cause interference to a sound output frequency from an adjacent protrusion. For example, a sound output frequency from the first protrusion 231 can cause constructive interference and destructive interference to a sound output frequency from the second protrusion 232. For example, sound output frequencies respectively from the first and second protrusions 231 and 232 may be synthesized. When constructive interference occurs between the first and second protrusions 231 and 232, a frequency corresponding to a sum of sound frequencies of the first and second protrusions 231 and 232 may be output. Also, when destructive interference occurs between the first and second protrusions 231 and 232, a frequency equal to a difference between the sound frequencies of the first and second protrusions 231 and 232 may be output. Also, a sound output frequency from the second protrusion 232 can cause constructive interference and destructive interference to a sound output frequency from each of the first and third protrusions 231 and 233.

According to an embodiment, the piezoelectric element 230 may output a sound having an audible frequency domain by synthesizing sound output frequencies respectively from the first to fourth protrusions 231 to 234. Here, the audible frequency domain may be 20 Hz to 20 kHz, which may be a value which flexibly varies. However, the present embodiment is not limited thereto. Hereinafter, an embodiment of the present disclosure will be described on the assumption that the audible frequency domain corresponds to 20 Hz to 20 kHz. For example, if the first protrusion 231 outputs a sound frequency having 1,000 kHz and the second protrusion 232 outputs a sound frequency having 101 kHz, sound frequencies respectively output from the first and second protrusions 231 and 232 may be synthesized. When constructive interference occurs between the first and second protrusions 231 and 232, a sound frequency (i.e., a frequency of 201 kHz) corresponding to a sum of the sound frequencies respectively output from the first and second protrusions 231 and 232 may be output. Also, when destructive interference occurs between the first and second protrusions 231 and 232, a sound frequency, i.e., a frequency of 1 kHz corresponding to a difference between the sound frequencies respectively output from the first and second protrusions 231 and 232 may be output. As a result, each of the first and second protrusions 231 and 232 may output a sound (100 kHz or 101 kHz) outside the audible frequency domain, and even when constructive interference occurs between the first and second protrusions 231 and 232, a sound (201 kHz) outside the audible frequency domain may be output. However, when destructive interference occurs between the first and second protrusions 231 and 232, a sound (1 kHz) within the audible frequency domain may be output. Therefore, even when a sound outside the audible frequency domain is output through the plurality of protrusions of the piezoelectric element 230, the display apparatus according to the present embodiment may synthesize frequencies to provide a viewer with a sound within the audible frequency domain. As described above, the display apparatus according to the present embodiment may synthesize sound frequencies output from the piezoelectric element 230 to provide a sound having a straight characteristic in the audible frequency domain.

According to an embodiment, an operation of synthesizing sound frequencies respectively output from the first to fourth protrusions 231 to 234 may be performed on only a sound which is output toward the front of the display apparatus. For example, a frequency synthesis may not be performed on a sound which is output toward a peripheral region instead of the front of the display apparatus. Since the piezoelectric element 230 outputs a sound outside the audible frequency domain through each of the plurality of protrusions, viewers outside the front of the display apparatus cannot listen to a sound output from the sound output module 200. Accordingly, the display apparatus according to the present embodiment may synthesize sound frequencies output from the piezoelectric element 230 to provide a sound having a straight characteristic in the audible frequency domain, thereby providing a directionality of a sound.

According to an embodiment, two adjacent protrusions of the first to fourth protrusions 231 to 234 may output sounds having different frequencies. For example, if the first protrusion 231 outputs a sound frequency having A Hz (where A is a constant), the second protrusion 232 may output a sound frequency having B Hz (where B is a constant). Also, if the second protrusion 232 outputs a sound frequency having B Hz, the third protrusion 233 may output a sound frequency having A Hz, or may output a sound frequency instead of A Hz or B Hz. The first protrusion 231 and the third protrusion 233 may output sounds having the same frequency, or may output sounds having different frequencies. For example, the first to fourth protrusions 231 to 234 may output sounds having different frequencies, or only adjacent protrusions may output sounds having different frequencies.

Figure 12:
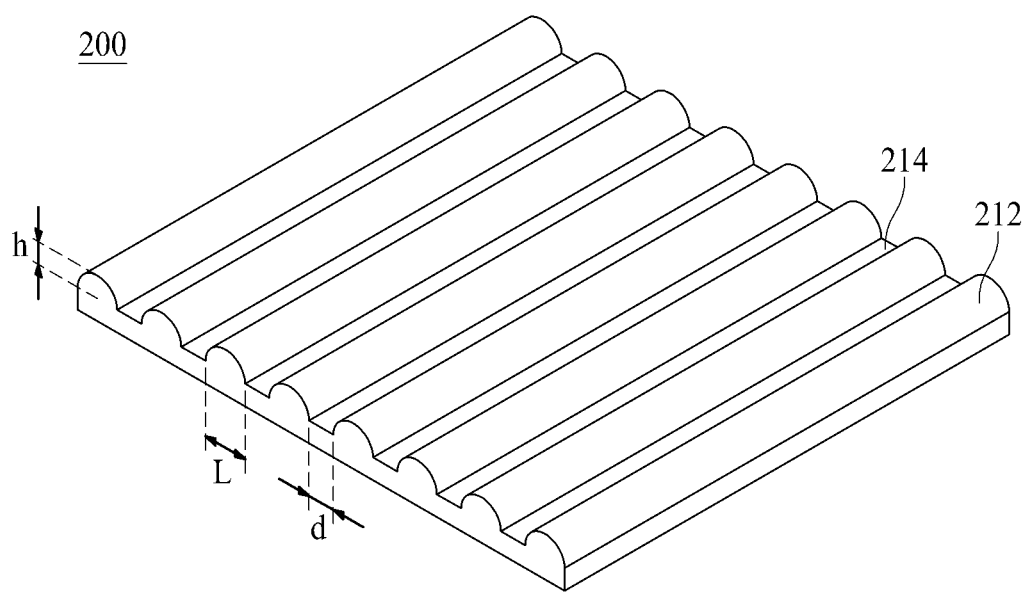
FIG. 12 is a diagram illustrating a plurality of protrusion patterns, having a type where lines are spaced apart from one another, of a support plate, in a display apparatus according to an embodiment of the present disclosure.

FIG. 12 is a diagram illustrating a plurality of protrusion patterns, having a type where lines are spaced apart from one another, of a support plate, in a display apparatus according to an embodiment of the present disclosure.

Referring to FIG. 12, the support plate 210 may include a plurality of protrusion patterns 212 and an even surface 214. The plurality of protrusion patterns 212 may protrude from the even surface 214 and may each become a source which allows a sound output module 200 to output a sound. For example, the winding piezoelectric element 230 may include a plurality of protrusions respectively corresponding to positions of the plurality of protrusion patterns 212. Therefore, the sound output module 200 may output a sound through each of the plurality of protrusions of the piezoelectric element 230. The plurality of protrusion patterns 212 may be formed as one body with the support plate 210, or after the support plate 210 is first formed, the plurality of protrusion patterns 212 may be formed through a subsequent process.

According to an embodiment, each of the plurality of protrusion patterns 212 may have a line shape. The line shape of each of the plurality of protrusion patterns 212 may have a certain height h and a width of bottom surface l. Bottom surfaces of the plurality of protrusion patterns 212 may be spaced apart from each other by a certain distance d.

According to an embodiment, the width of bottom surface l of each of the plurality of protrusion patterns 212 may be greater than the height h. In a case where the width of bottom surface l of each of the plurality of protrusion patterns 212 is greater than the height h, the piezoelectric element 230 may be more strongly attached on the support plate 210 using an adhesive member than an opposite case where the width of bottom surface I of each of the plurality of protrusion patterns 212 is smaller than the height h. Accordingly, the piezoelectric element 230 may be stably attached on the support plate 210, and thus, may be supported and fixed to the support plate 210.

Figure 13:
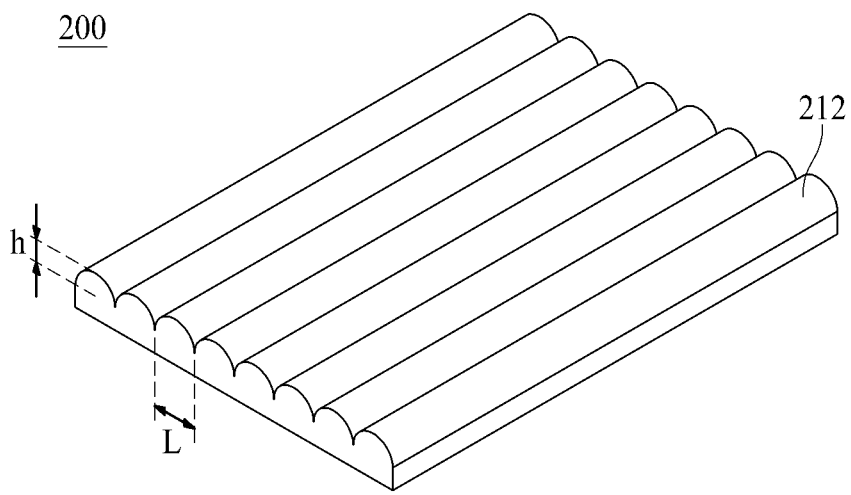
FIG. 13 is a diagram illustrating a plurality of protrusion patterns, having a type where lines contact each other, of a support plate, in a display apparatus according to an embodiment of the present disclosure.

FIG. 13 is a diagram illustrating a plurality of protrusion patterns, having a type where lines contact each other, of a support plate, in a display apparatus according to an embodiment of the present disclosure.

Referring to FIG. 13, the support plate 210 may include a plurality of protrusion patterns 212. The plurality of protrusion patterns 212 may each become a source which allows a sound output module 200 to output a sound. For example, the winding piezoelectric element 230 may include a plurality of protrusions respectively corresponding to positions of the plurality of protrusion patterns 212. Therefore, the sound output module 200 may output a sound through each of the plurality of protrusions of the piezoelectric element 230.

According to an embodiment, each of the plurality of protrusion patterns 212 may have a line shape. The line shape of each of the plurality of protrusion patterns 212 may have a certain height h and a width of bottom surface l. Bottom surfaces of the plurality of protrusion patterns 212 may contact each other. For example, the support plate 210 may include only the plurality of protrusion patterns 212 without an even surface.

According to an embodiment, the width of bottom surface l of each of the plurality of protrusion patterns 212 may be greater than the height h. In a case where the width of bottom surface l of each of the plurality of protrusion patterns 212 is greater than the height h, the piezoelectric element 230 may be more strongly attached on the support plate 210 using an adhesive member than an opposite case where the width of bottom surface I of each of the plurality of protrusion patterns 212 is smaller than the height h.

Figure 14:
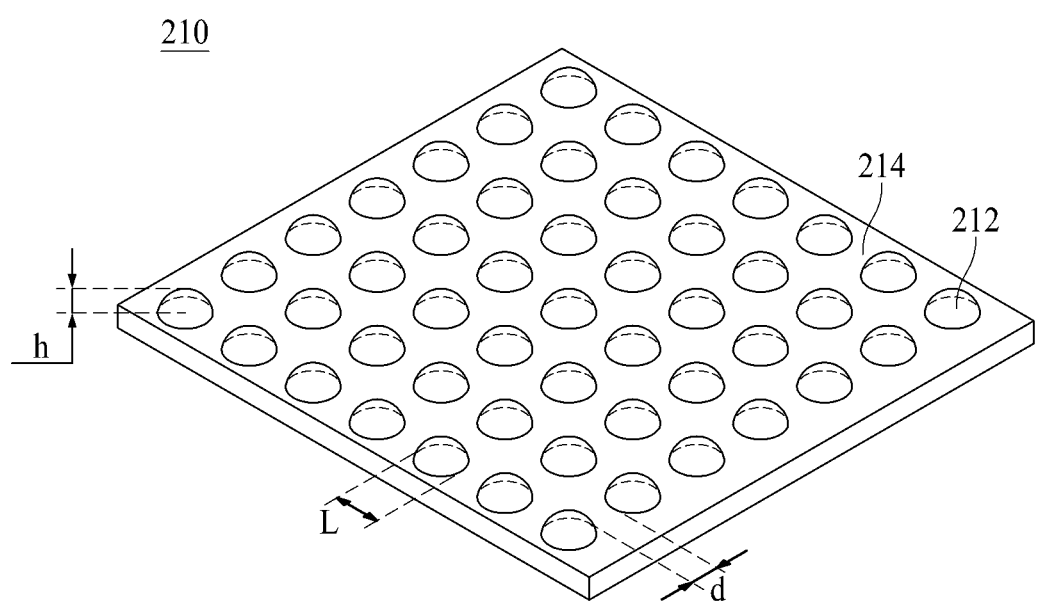
FIG. 14 is a diagram illustrating a plurality of protrusion patterns, having a type where dots are spaced apart from one another, of a support plate, in a display apparatus according to an embodiment of the present disclosure.

FIG. 14 is a diagram illustrating a plurality of protrusion patterns, having a type where dots are spaced apart from one another, of a support plate, in a display apparatus according to an embodiment of the present disclosure.

Referring to FIG. 14, the support plate 210 may include a plurality of protrusion patterns 212 and an even surface 214. The plurality of protrusion patterns 212 may protrude from the even surface 124 and may each become a source which allows a sound output module 200 to output a sound. For example, the winding piezoelectric element 230 may include a plurality of protrusions respectively corresponding to positions of the plurality of protrusion patterns 212. Therefore, the sound output module 200 may output a sound through each of the plurality of protrusions of the piezoelectric element 230.

According to an embodiment, each of the plurality of protrusion patterns 212 may have a dot shape. The dot shape of each of the plurality of protrusion patterns 212 may have a certain height h and a width of bottom surface l. Bottom surfaces of the plurality of protrusion patterns 212 may be spaced apart from each other by a certain distance d.

According to an embodiment, the width of bottom surface l of each of the plurality of protrusion patterns 212 may be greater than the height h. In a case where the width of bottom surface l of each of the plurality of protrusion patterns 212 is greater than the height h, the piezoelectric element 230 may be more strongly attached on the support plate 210 using an adhesive member than an opposite case where the width of bottom surface I of each of the plurality of protrusion patterns 212 is smaller than the height h.

Figure 15:
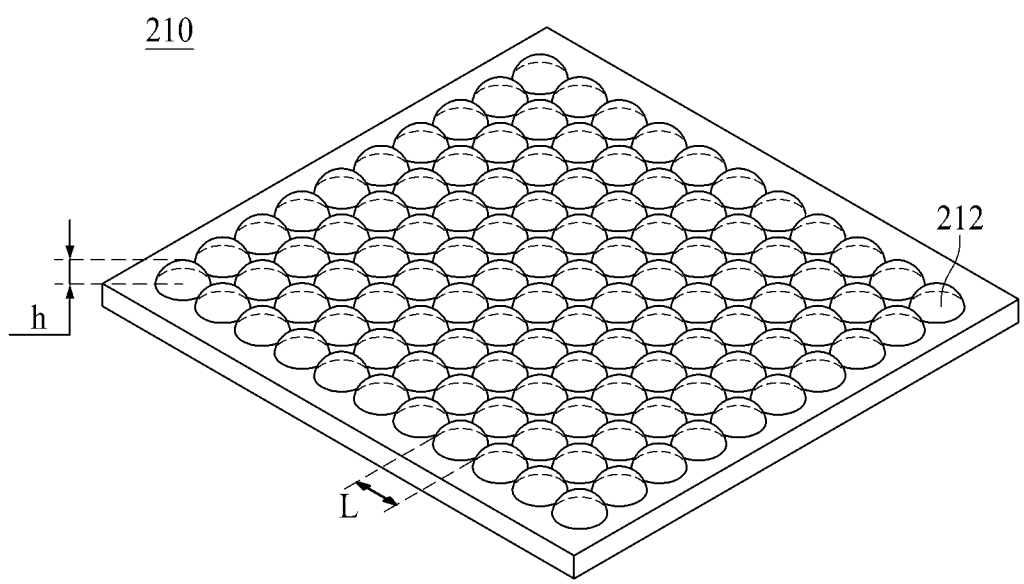
FIG. 15 is a diagram illustrating a plurality of protrusion patterns, having a type where dots contact each other, of a support plate, in a display apparatus according to an embodiment of the present disclosure.

FIG. 15 is a diagram illustrating a plurality of protrusion patterns, having a type where dots contact each other, of a support plate, in a display apparatus according to an embodiment of the present disclosure.

Referring to FIG. 15, the support plate 210 may include a plurality of protrusion patterns 212. The plurality of protrusion patterns 212 may each become a source which allows a sound output module 200 to output a sound. For example, the winding piezoelectric element 230 may include a plurality of protrusions respectively corresponding to positions of the plurality of protrusion patterns 212. Therefore, the sound output module 200 may output a sound through each of the plurality of protrusions of the piezoelectric element 230.

According to an embodiment, each of the plurality of protrusion patterns 212 may have a dot shape. The dot shape of each of the plurality of protrusion patterns 212 may have a certain height h and a width of bottom surface l. Bottom surfaces of the plurality of protrusion patterns 212 may contact each other. For example, the support plate 210 may include only the plurality of protrusion patterns 212 without an even surface.

According to an embodiment, the width of bottom surface l of each of the plurality of protrusion patterns 212 may be greater than the height h. In a case where the width of bottom surface l of each of the plurality of protrusion patterns 212 is greater than the height h, the piezoelectric element 230 may be more strongly attached on the support plate 210 using an adhesive member than an opposite case where the width of bottom surface l of each of the plurality of protrusion patterns 212 is smaller than the height h.

As described above, the display apparatus according to the embodiments of the present disclosure may output a sound so that a traveling direction of the sound becomes a direction toward the front surface of the display panel. Accordingly, an output position of an image displayed by the display apparatus may be matched with an output position of a sound output from the display apparatus, thereby enhancing an immersion of a viewer who is watching the image displayed by the display apparatus.

And, in the display apparatus according to the embodiments of the present disclosure, since the sound output module including the winding piezoelectric element is provided, a directionality of a sound may be controlled by synthesizing sound frequencies, thereby maximizing a sense of reality and immersion.

And, in the display apparatus according to the embodiments of the present disclosure, since the sound output module is attached on the front surface or the rear surface of the display panel, a speaker is not separately provided, and thus, a degree of freedom in speaker disposition or arrangement is enhanced and an aesthetic design appearance of a set apparatus is enhanced.

And, the display apparatus according to the embodiments of the present disclosure may be applied to flexible display devices or apparatuses, rollable display devices or apparatuses, curved display devices or apparatuses, wearable display devices or apparatuses, bendable display devices or apparatuses, etc., but is not limited thereto.

The display apparatus according to the embodiments of the present disclosure will be described as follows.

A display apparatus according to the present disclosure includes a display panel, a back cover accommodating the display panel, and a sound output unit including at least one sound output module disposed to overlap the display panel, wherein the at least one sound output module includes a support plate including an uneven surface and a piezoelectric element attached on the uneven surface of the support plate and has a shape corresponding to the uneven surface of the support plate.

According to some embodiments of the present disclosure, the sound output unit may be disposed on a front surface of the display panel.

According to some embodiments of the present disclosure, the display apparatus may further include a protection member disposed on the sound output unit to protect the sound output unit, and an air gap may be provided between the protection member and the sound output unit.

According to some embodiments of the present disclosure, the sound output unit may be disposed between the display panel and the back cover.

According to some embodiments of the present disclosure, the display panel may include a pixel array layer disposed on a base substrate and an encapsulation plate covering the pixel array layer, and the piezoelectric element may include a first electrode attached on the uneven surface of the support plate and a vibration layer disposed between the first electrode and the encapsulation plate.

According to some embodiments of the present disclosure, the encapsulation plate may be used as a second electrode applying a sound signal to the vibration layer of the piezoelectric element.

According to some embodiments of the present disclosure, the vibration layer may be deformed in at least one of a thickness direction and a lengthwise direction according to the sound signal applied to the encapsulation plate and the first electrode and outputs a sound by using vibration due to the deformation.

According to some embodiments of the present disclosure, an air gap may be provided between the at least one sound output module and the display panel.

According to some embodiments of the present disclosure, the display apparatus may further include a protection member disposed on the display panel to protect the display panel.

According to some embodiments of the present disclosure, the sound output unit may include a first sound output unit disposed on a front surface of the display panel, the first sound output unit including the at least one sound output module, and a second sound output unit disposed between the display panel and the back cover, the second sound output unit including the at least one sound output module.

According to some embodiments of the present disclosure, the first sound output unit may overlap the display panel in the same region as a region where the second sound output unit overlaps the display panel.

According to some embodiments of the present disclosure, the first sound output unit may overlap the display panel in a region which differs from a region where the second sound output unit overlaps the display panel.

According to some embodiments of the present disclosure, the piezoelectric element may include a plurality of protrusions.

According to some embodiments of the present disclosure, two adjacent protrusions of the plurality of protrusions may output sounds having different frequencies.

According to some embodiments of the present disclosure, the uneven surface of the support plate may include a plurality of protrusion patterns.

According to some embodiments of the present disclosure, each of the plurality of protrusion patterns may have a line shape or a dot shape.

According to some embodiments of the present disclosure, in each of the plurality of protrusion patterns, a width of a bottom surface may be greater than a height.

According to some embodiments of the present disclosure, bottom surfaces of the plurality of protrusion patterns may contact each other.

According to some embodiments of the present disclosure, bottoms of the plurality of protrusion patterns may be spaced apart from one another.

According to some embodiments of the present disclosure, the piezoelectric element may include one of silicon, acryl, and urethane or one of polyvinylidene fluoride trifluoroethylene (PVDF-TrFE) and lead zirconate titanate (PZT).

According to some embodiments of the present disclosure, the display apparatus may further include a driving circuit unit independently controlling the plurality of sound output modules respectively disposed in a plurality of regions of a front surface or a rear surface of the display panel, based on an image which is to be displayed by the display panel.

According to some embodiments of the present disclosure, the driving circuit unit may include a controller extracting sound data and sound position data, based on image input data displayed by the display panel and a driver generating a sound signal, based on the sound data and supplying the sound signal to a sound output module, corresponding to the sound position data, of the plurality of sound output modules respectively disposed in the plurality of regions.

According to some embodiments of the present disclosure, in a case where the sound output unit includes a plurality of sound output modules, the display apparatus may further include a partition dividing the plurality of sound output modules.

The display apparatus according to the embodiments of the present disclosure may output a sound so that a traveling direction of the sound becomes a direction toward the front surface of the display panel. Accordingly, an output position of an image displayed by the display apparatus may be matched with an output position of a sound output from the display apparatus, thereby enhancing an immersion of a viewer who is watching the image displayed by the display apparatus.

And, in the display apparatus according to the embodiments of the present disclosure, since the sound output module is attached on the front surface or the rear surface of the display panel, a speaker is not separately provided, and thus, a degree of freedom in speaker disposition or arrangement is enhanced and an aesthetic design appearance of a set device or apparatus is enhanced.

And, according to the embodiments of the present disclosure, the sound output module including the winding piezoelectric element may be provided, thereby providing a display apparatus which includes the sound output module for maximizing a sense of reality and immersion.

And, according to the embodiments of the present disclosure, since the sound output module including the winding piezoelectric element is provided, a directionality of an output sound may be controlled by synthesizing frequencies of output sounds, thereby providing a display apparatus for enhancing a sense of reality and immersion.

And, the display apparatus according to the embodiments of the present disclosure may further include the protection member for protecting the at least one sound output module or the display panel, and thus, prevents the damage and malfunction of the display apparatus.

It will be apparent to those skilled in the art that various modifications and variations can be made in the display apparatus of the present disclosure without departing from the spirit or scope of the disclosure. Thus, it is intended that the present disclosure cover the modifications and variations of this disclosure provided they come within the scope of the appended claims and their equivalents.

What is claimed is:

1. A display apparatus, comprising:
   a display panel;
   a back cover accommodating the display panel; and
   a sound output unit including at least one sound output module disposed to overlap the display panel,
   wherein the at least one sound output module comprises:
   a support plate including an uneven surface; and
   a piezoelectric element attached on the uneven surface of the support plate and has a shape corresponding to the uneven surface of the support plate.

2. The display apparatus of claim 1, wherein the sound output unit is disposed on a front surface of the display panel.

3. The display apparatus of claim 2, further comprising a protection member disposed on the sound output unit,
   wherein an air gap is provided between the protection member and the sound output unit.

4. The display apparatus of claim 1, wherein the sound output unit is disposed between the display panel and the back cover.

5. The display apparatus of claim 4, wherein
   the display panel comprises:
   a pixel array layer disposed on a base substrate; and
   an encapsulation plate covering the pixel array layer, and the piezoelectric element comprises:
a first electrode attached on the uneven surface of the support plate; and
a vibration layer disposed between the first electrode and the encapsulation plate.

6. The display apparatus of claim 5, wherein the encapsulation plate is a second electrode applying a sound signal to the vibration layer of the piezoelectric element.

7. The display apparatus of claim 5, wherein the vibration layer is deformed in at least one of a thickness direction and a lengthwise direction according to the sound signal applied to the encapsulation plate and the first electrode, and outputs a sound by vibration due to the deformation.

8. The display apparatus of claim 4, wherein an air gap is provided between the at least one sound output module and the display panel.

9. The display apparatus of claim 4, further comprising a protection member disposed on the display panel to protect the display panel.

10. The display apparatus of claim 1, wherein the sound output unit comprises:
a first sound output unit disposed on a front surface of the display panel, the first sound output unit including the at least one sound output module; and
a second sound output unit disposed between the display panel and the back cover, the second sound output unit including the at least one sound output module.

11. The display apparatus of claim 10, wherein the first sound output unit overlaps the display panel in the same region as a region where the second sound output unit overlaps the display panel.

12. The display apparatus of claim 10, wherein the first sound output unit overlaps the display panel in a region which differs from a region where the second sound output unit overlaps the display panel.

13. The display apparatus of claim 1, wherein the piezoelectric element comprises a plurality of protrusions.

14. The display apparatus of claim 13, wherein two adjacent protrusions of the plurality of protrusions output sounds having different frequencies.

15. The display apparatus of claim 1, wherein the uneven surface of the support plate comprises a plurality of protrusion patterns.

16. The display apparatus of claim 15, wherein each of the plurality of protrusion patterns has a line shape or a dot shape.

17. The display apparatus of claim 15, wherein in each of the plurality of protrusion patterns, a width of a bottom surface is greater than a height.

18. The display apparatus of claim 15, wherein each of bottom surfaces of the plurality of protrusion patterns contacts each other.

19. The display apparatus of claim 15, wherein each of bottom surfaces of the plurality of protrusion patterns is spaced apart from one another.

20. The display apparatus of claim 1, wherein the piezoelectric element comprises one of silicon, acryl, and urethane or one of polyvinylidene fluoride trifluoroethylene (PVDF-TrFE) and lead zirconate titanate (PZT).

21. The display apparatus of claim 1, wherein
the at least one sound output module comprises a plurality of sound output modules,
the plurality of sound output modules are respectively disposed in a plurality of regions of a front surface or a rear surface of the display panel, and
the display apparatus further comprises a driving circuit unit independently controlling the plurality of sound output modules.

22. The display apparatus of claim 21, wherein the driving circuit unit comprises:
a controller extracting sound data and sound position data, based on image input data displayed by the display panel; and
a driver generating a sound signal, based on the sound data and supplying the sound signal to a sound output module, corresponding to the sound position data, of the plurality of sound output modules respectively disposed in the plurality of regions.

23. The display apparatus of claim 1, wherein
the at least one sound output module comprises a plurality of sound output modules, and
the display apparatus further comprises a partition dividing the plurality of sound output modules.

* * * * *